United States Patent
Hsu et al.

(10) Patent No.: US 9,812,322 B2
(45) Date of Patent: Nov. 7, 2017

(54) SAPPHIRE SUBSTRATE WITH PATTERNED STRUCTURE

(71) Applicants: Epileds Technologies, Inc., Tainan (TW); Lucemitek Co., Ltd., Taoyuan (TW)

(72) Inventors: Kung-Hsieh Hsu, Tainan (TW);
Cheng-Yu Chiu, Taoyuan (TW);
Ming-Sen Hsu, Tainan (TW);
Chun-Hung Chen, Taoyuan (TW);
Chun-Yi Lee, Taoyuan (TW)

(73) Assignee: Epileds Technologies, Inc., Tainan (TW)

( * ) Notice: Subject to any disclaimer, the term of this patent is extended or adjusted under 35 U.S.C. 154(b) by 0 days.

(21) Appl. No.: 14/836,679

(22) Filed: Aug. 26, 2015

(65) Prior Publication Data

US 2017/0062655 A1 Mar. 2, 2017

(51) Int. Cl.
*H01L 33/12* (2010.01)
*H01L 21/02* (2006.01)
*C30B 25/18* (2006.01)
*H01L 33/00* (2010.01)

(52) U.S. Cl.
CPC ......... *H01L 21/0254* (2013.01); *C30B 25/18* (2013.01); *H01L 21/0242* (2013.01); *H01L 21/0243* (2013.01); *H01L 33/007* (2013.01)

(58) Field of Classification Search
CPC ............. H01L 21/0237; H01L 21/0241; H01L 33/20; H01L 33/38; H01L 23/04; H01L 21/48; H01L 33/007; H01L 33/12; H01L 21/0254; H01L 21/0242; H01L 21/0243
See application file for complete search history.

(56) References Cited

U.S. PATENT DOCUMENTS

| | | | | |
|---|---|---|---|---|
| 6,870,191 B2* | 3/2005 | Niki | ...... | H01L 33/007 257/113 |
| 7,754,504 B2* | 7/2010 | Ohmae | ...... | H01L 33/007 257/88 |
| 8,796,055 B2* | 8/2014 | Tanaka | ...... | H01L 33/007 257/98 |
| 8,928,004 B2* | 1/2015 | Choe | ...... | C30B 25/04 257/76 |
| 2005/0001227 A1* | 1/2005 | Niki | ...... | H01L 33/007 257/98 |
| 2005/0179130 A1* | 8/2005 | Tanaka | ...... | H01L 21/0237 257/730 |
| 2006/0258027 A1* | 11/2006 | Ohmae | ...... | H01L 33/007 438/22 |
| 2010/0178616 A1* | 7/2010 | Lin | ...... | H01L 33/22 430/323 |

(Continued)

*Primary Examiner* — Fazli Erdem
(74) *Attorney, Agent, or Firm* — Wang Law Firm, Inc.

(57) ABSTRACT

A sapphire substrate with patterned structure includes a sapphire base; a plurality of the cavities formed on a surface of the sapphire base; and a template layer. The plurality of the cavities are periodically arranged at a predetermined distance from each other, and each of the plurality of the cavities has a bottom surface and a top opening. Each of the plurality of the cavities comprises at least a first and a second inclined surfaces, and the first and the second inclined surfaces are inclined by a first and a second angles respectively with respect to the bottom surface of the plurality of the cavities.

11 Claims, 9 Drawing Sheets

(56) References Cited

U.S. PATENT DOCUMENTS

| | | | |
|---|---|---|---|
| 2011/0012109 A1* | 1/2011 | Krylouk | H01L 21/0237 257/49 |
| 2011/0284895 A1* | 11/2011 | Hsu | H01L 33/20 257/98 |
| 2012/0292630 A1* | 11/2012 | Wu | H01L 33/32 257/76 |
| 2013/0092950 A1* | 4/2013 | Fujikura | C30B 29/403 257/76 |
| 2013/0187124 A1* | 7/2013 | Zhang | B82Y 20/00 257/13 |
| 2013/0256743 A1* | 10/2013 | Okuno | H01L 29/2003 257/103 |
| 2014/0353804 A1* | 12/2014 | Okuno | H01L 21/02609 257/628 |
| 2015/0325741 A1* | 11/2015 | Komada | H01L 33/0079 257/76 |

* cited by examiner

SAPPHIRE SUBSTRATE WITH PATTERNED STRUCTURE

BACKGROUND OF THE INVENTION

1. Field of the Invention

The present invention relates to a sapphire substrate, in particular to a sapphire substrate with patterned structure, which can be used in ultraviolet light-emitting diode (UV-LED).

2. Description of the Related Art

In recent years, the ultraviolet light emitting diode (UV-LED) has been attracted considerable attention due to their wide range of applications such as air or water purification, disinfection, medical phototherapy. High quality aluminum nitride (AlN) layer is commonly used as a crucial template layer between a sapphire substrate and aluminum gallium nitride (AlGaN) layer for the growth of AlGaN-based UV-LED. However, the AlN layer on a flat sapphire substrate usually suffers from very high threading dislocation densities (TDDs) due to the large lattice mismatch and thermal expansion mismatch between AlN and sapphire. To achieve high efficiency UV-LED, the development of a low-TDD AlN layer is very important because the TDDs in multi-quantum wells act as non-radiative recombination centers.

Various methods have been developed to reduce the TDDs, and one of the methods to reduce the TDDs is lateral epitaxial overgrowth (LEO) technique. LEO-AlN layer is usually grown on the patterned sapphire substrate (PSS), which can reduce the number of TDDs in the LEO-AlN layers. However, the LEO-AlN layer on the PSS requires a large coalescence thickness for the LEO-AlN layer and greatly increases the epitaxial time and cost. Besides, serious roughness is usually observed in the LEO-AlN layer grown on the PSS, which may affect subsequent growth of AlGaN-based UV-LED.

The above information disclosed in this Background section is only for enhancement of understanding of the background of the invention and therefore it may contain information that does not form the prior art that is already known in this country to a person having ordinary skill in the art.

SUMMARY OF THE INVENTION

In view of the shortcomings of the prior art, it is a primary objective of the present invention to provide a sapphire substrate with patterned structure in order to achieve a thinner coalescence thickness for the template layer and decrease the roughness of the template layer grown on the sapphire substrate.

To achieve the aforementioned objective, the present invention provides a sapphire substrate with patterned structure comprises a sapphire base; a plurality of the cavities formed on a surface of the sapphire base; and a template layer disposed on the sapphire base. The cavities are periodically arranged at a predetermined distance from each other, and each of the plurality of the cavities has a bottom surface and a top opening. Each of the plurality of the cavities comprises at least a first and a second inclined surface, and the first and the second inclined surfaces are inclined by a first and a second angles respectively with respect to the bottom surface of the plurality of the cavities.

Preferably, the first angle is smaller than the second angle, wherein the first angle is in a range between 30 and 90 degrees, and the second angle is in a range between 75 and 90 degrees.

Preferably, the predetermined distance is in a range between 0.5 and 5 μm.

Preferably, a width of the bottom surface of each of the plurality of the cavities is in a range between 0.1 and 4.5 μm.

Preferably, a width of the top opening of each of the plurality of the cavities is in a range between 0.5 and 5 μm.

Preferably, a width of a boundary between each of the plurality of the cavities is in a range between 0.001 and 1 μm.

Preferably, a height of each of the plurality of the cavities is in a range between 0.1 and 5 μm.

Preferably, a height from the bottom surface to an interface between the first and the second inclined surfaces is in a range between 0.05 and 4.5 μm.

Preferably, the plurality of the cavities are arranged in hexagonal close-packing.

Preferably, a material of the template layer is selected from a group consisting of aluminum nitride (AlN), aluminium gallium nitride (AlGaN), aluminum gallium indium nitride (AlGaInN) and gallium nitride (GaN).

Preferably, a thick of the template layer is in a range between 1 and 15 μm, and a surface roughness of the template layer is in a range between 0.001 and 0.5 μm.

In summation, the sapphire substrate with patterned structure of the present invention has one or more of the following advantages:

(1) By utilizing the plurality of the cavities being arranged in hexagonal close-packing, the present invention is capable of significantly reducing the TDDs in the template layer grown on the sapphire substrate, thereby achieving high efficiency UV-LED fabricated on the sapphire substrate.

(2) By utilizing the cavities with at least two inclined surfaces, the present invention is capable of achieving a thinner coalescence thickness for template layer and decreasing the surface roughness of template layers grown on the sapphire substrate, thereby decreasing the epitaxial time and cost for fabricating UV-LED.

BRIEF DESCRIPTION OF THE DRAWINGS

Hereinafter, embodiments of the present invention will be described in detail with reference to the accompanying drawings so that those skilled in the art to which the present invention pertains can realize the present invention, wherein.

DESCRIPTION OF THE PREFERRED EMBODIMENTS

The exemplary embodiments of the present invention will be understood more fully from the detailed description given below and from the accompanying drawings of various embodiments of the invention, which, however, should not be taken to limit the invention to the specific embodiments, but are for explanation and understanding only. To clarify the description of the exemplary embodiments, the same reference numbers will be used throughout the drawings to refer to the same or like parts.

Figure 1A:
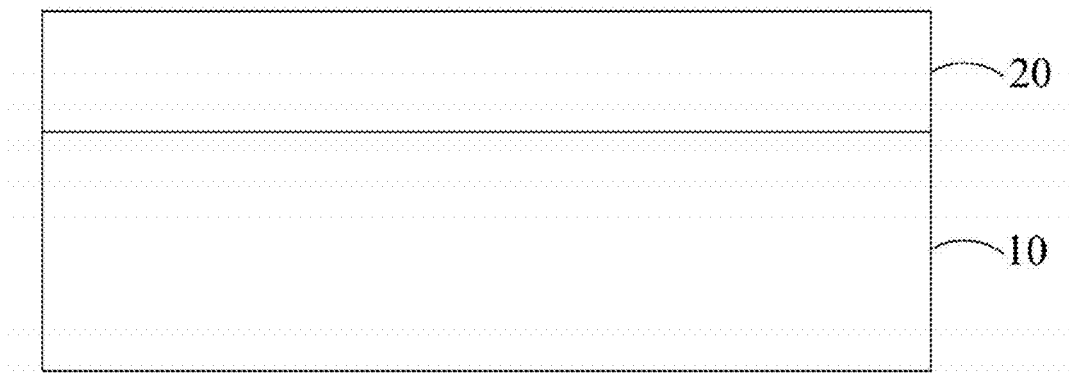
FIGS. 1A to 1F are cross-sectional views illustrating a process for manufacturing a sapphire substrate with patterned structure in accordance with a preferred embodiment of the present invention.
Figure 1B:
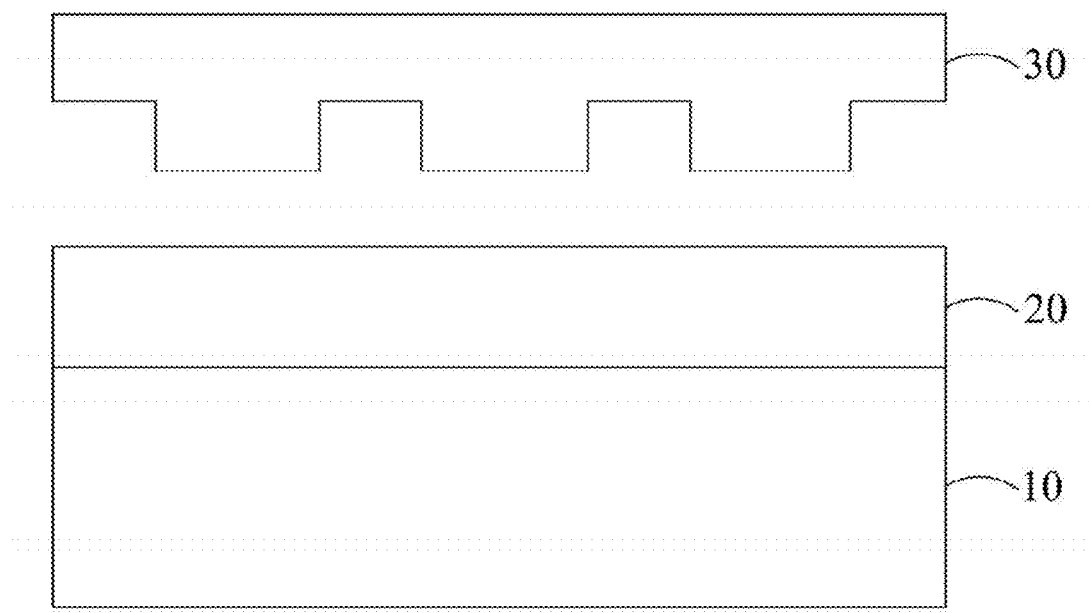
Figure 1C:
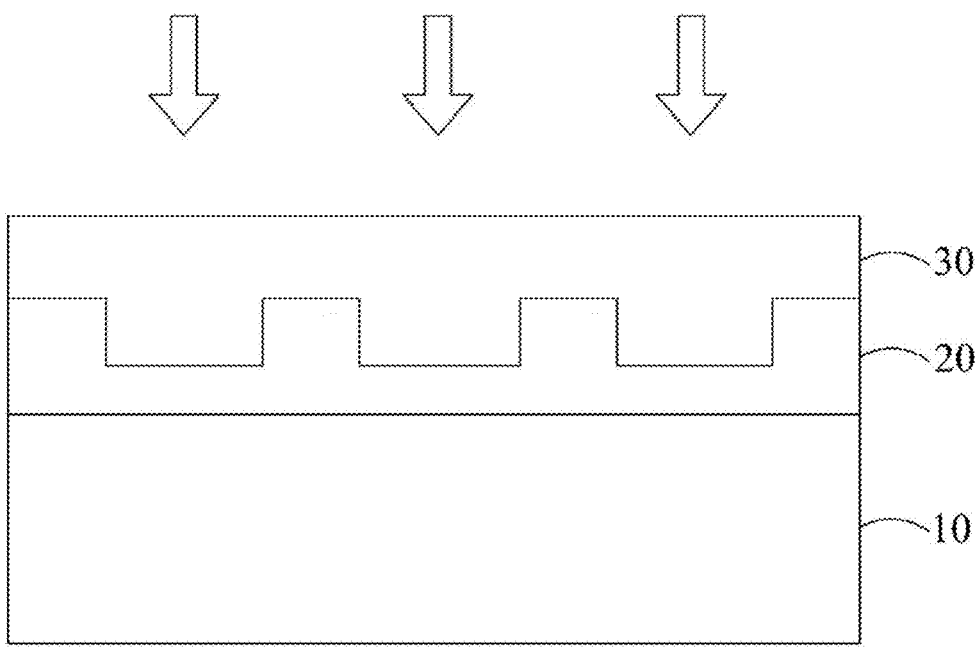
Figure 1D:
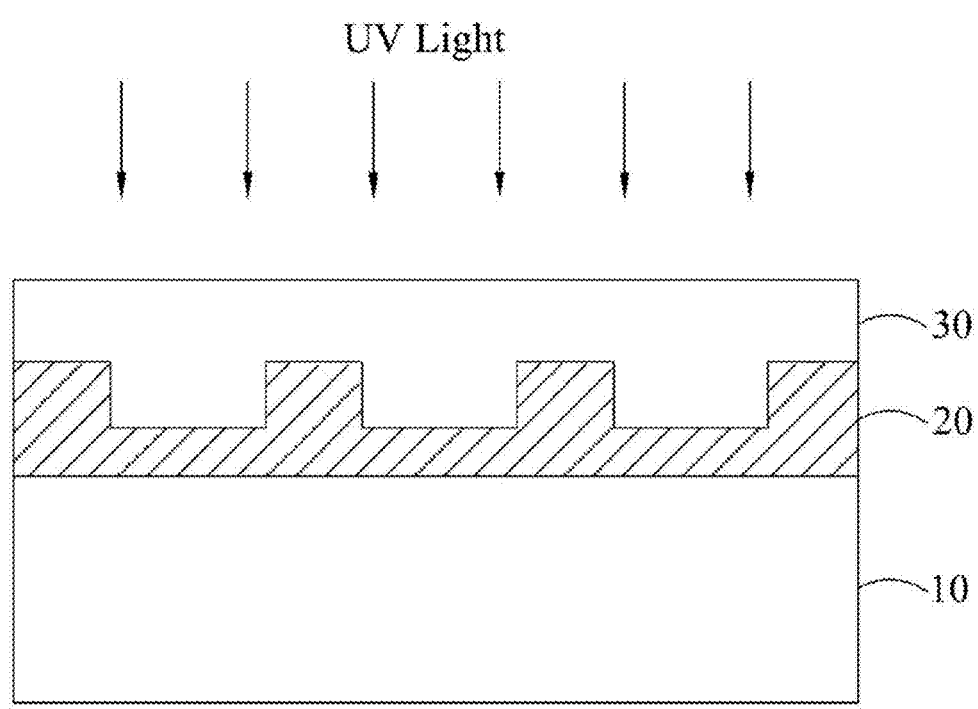
Figure 1E:
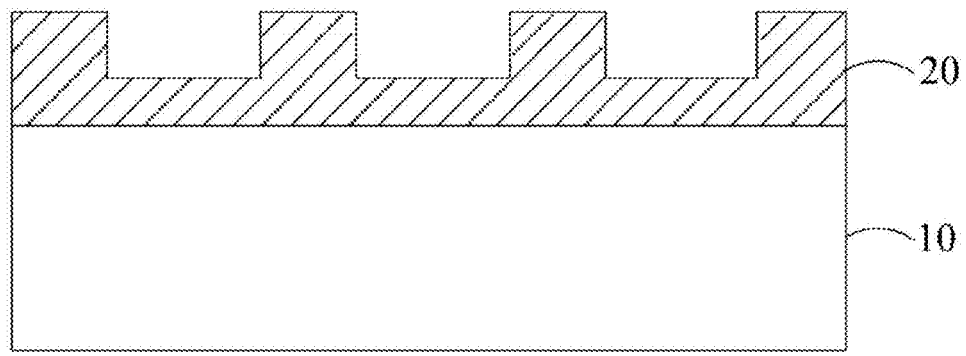
Figure 1F:
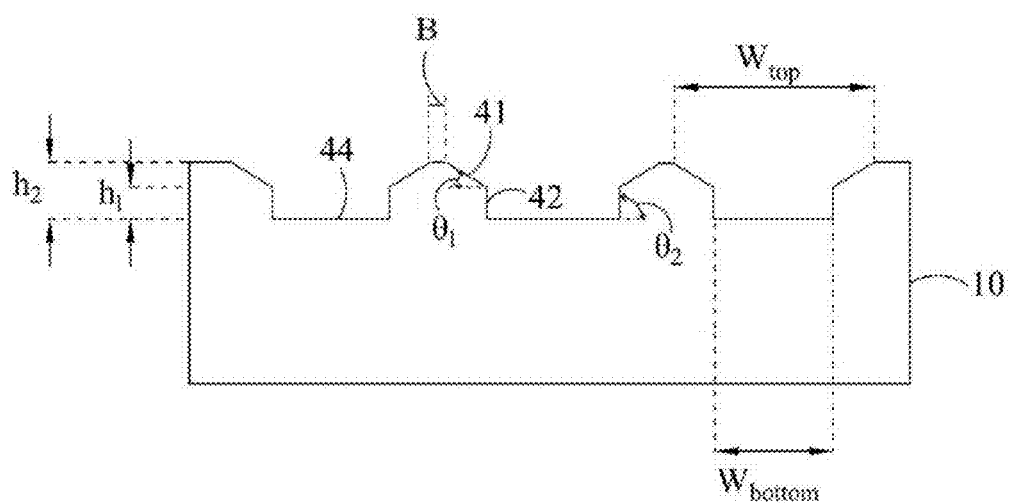
Figure 2:
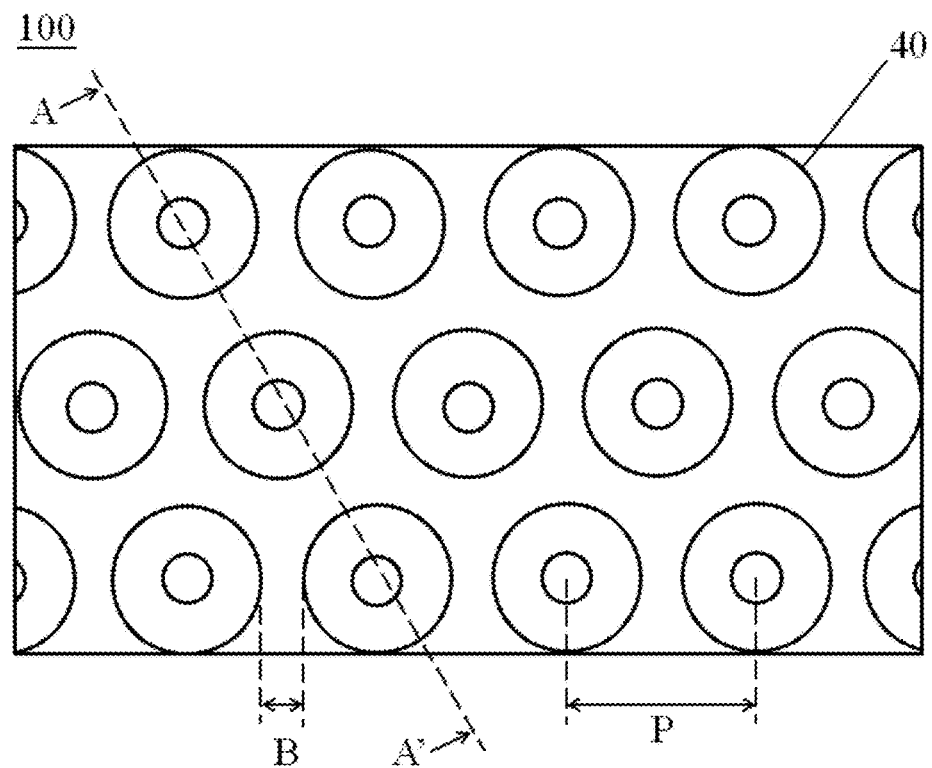
FIG. 2 is a top view illustrating the sapphire substrate with patterned structure in accordance with the preferred embodiment of the present invention.

Please refer to FIGS. 1A to 1F and 2, FIGS. 1A to 1F are cross-sectional views illustrating a process for manufacturing a sapphire substrate with patterned structure in accordance with a preferred embodiment of the present invention. FIG. 2 is a top view illustrating the sapphire substrate with patterned structure in accordance with the preferred embodiment of the present invention.

The process for manufacturing the sapphire substrate 100 with patterned structure in accordance with the preferred embodiment of the present invention takes the nano-imprint method for example, but the present invention is not limited thereto.

First, a UV-cured resin 20 is spin-coated onto a sapphire base 10 (FIG. 1A), and a mold 30 is disposed over the sapphire base 10 (FIG. 1B). The mold 30 has a template pattern which will be replicated onto (transferred to) the UV-cured resin 20. The mold 30 is made of a material such as transparent quartz or polymer which allows a transmission of UV light. Next, the pressure is applied to the mold 30 (FIG. 1C). The UV light is irradiated through the mold 30 while applying the pressure, the UV-cured resin 20 is cured by the UV curing reaction (FIG. 1D). Thereafter, the mold 30 is removed leaving a pattern of the UV-cured resin 20 on the sapphire base 10 (FIG. 1E), which the pattern is a replica of the template pattern of the mold 30. Hence, the sapphire base 10 having an etching template with a patterned UV-cured resin 20 is obtained. The patterned UV-cured resin 20 is used as an etching template to pattern the sapphire base 10 through the lithography and etching process by controlling the etching selectivity. After the patterned UV-cured resin 20 is removed, a plurality of cavities 40 (i.e. patterned structure) having at least two inclined surfaces are formed on the surface of the sapphire base 10 (FIG. 1F, which is a cross-sectional view of the sapphire substrate 100 along the A-A' line in FIG. 2). Therefore, the sapphire substrate 100 with patterned structure is obtained, and a template layer (e.g., AlN layer; see FIG. 4) is subsequently grown on the sapphire substrate 100 for fabricating AlGaN-based UV-LED.

The plurality of the cavities 40 are periodically arranged at a predetermined distance P from each other. In the preferred embodiment, the predetermined distance P may be in a range between about 0.5 and 5 µm. Each of the plurality of the cavities 40 has a bottom surface 44 and a top opening. In the preferred embodiment, the bottom surface 44 and the top opening have a shape of circle, but the present invention is not limited thereto. In the preferred embodiment, a width $W_{bottom}$ of the bottom surface 44 of each of the plurality of the cavities 40 may be in a range between about 0.1 and 4.5 µm, and a width $W_{top}$ of the top opening of each of the plurality of the cavities 40 may be in a range between about 0.5 and 5 µm.

Each of the plurality of the cavities 40 further comprises at least a first inclined surface 41 and a second inclined surface 42, and the first inclined surface 41 and the second inclined surface 42 are inclined by a first angle $\theta_1$ and a second angle $\theta_2$ respectively with respect to the bottom surface 44 of the plurality of the cavities 40, wherein the first angle $\theta_1$ is smaller than the second angle $\theta_2$ (i.e., a slope of the first inclined surface 41 with respect to the bottom surface 44 is smaller than a slope of the second inclined surface 42 with respect to the bottom surface 44). In the preferred embodiment, the first angle $\theta_1$ may be in a range between about 30 and 90 degrees, and the second angle $\theta_2$ may be in a range between about 75 and 90 degrees. In the preferred embodiment, a height $h_2$ of each of the plurality of the cavities 40 may be in a range between about 0.1 and 5 µm, and a height $h_1$ from the bottom surface 44 to an interface between the first inclined surface 41 and the second inclined surface 42 may be in a range between about 0.05 and 4.5 µm. The present invention is not limited to only two inclined surfaces, the plurality of the cavities 40 may be designed to be three or more inclined surfaces.

In the preferred embodiment, the plurality of the cavities 40 may be arranged in hexagonal close-packing, and a width of a boundary B between each of the plurality of the cavities 40 may be in a range between about 0.001 and 1 µm. By this limitation, the TDDs in the template layer grown on sapphire substrate 100 can be significantly reduced, thereby improving the efficiency of UV-LEDs fabricated on the sapphire substrate 100 of the present invention.

Figure 3:
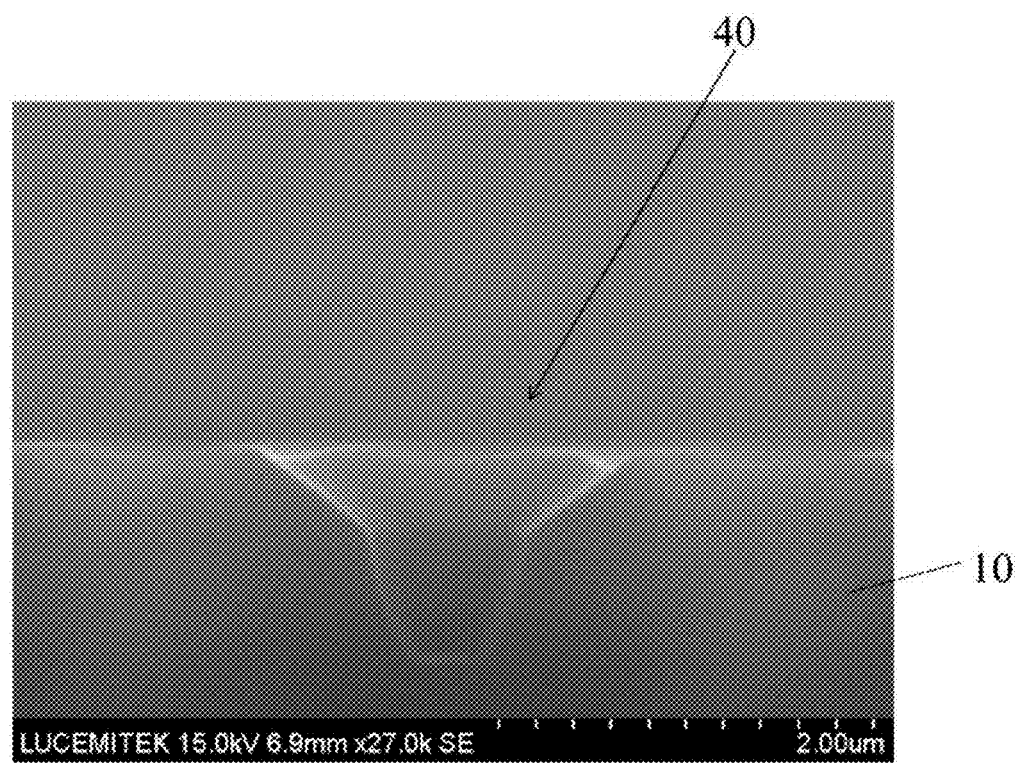
FIG. 3 is cross-sectional scanning electron microscope (SEM) diagram of a cavity of the sapphire substrate with patterned structure in accordance with the preferred embodiment of the present invention.

Please refer to FIG. 3, FIG. 3 is cross-sectional scanning electron microscope (SEM) diagram of a cavity of the sapphire substrate with patterned structure in accordance with the preferred embodiment of the present invention. The plurality of the cavities 40 formed on the surface of the sapphire base 10 can be observed clearly.

Figure 4:
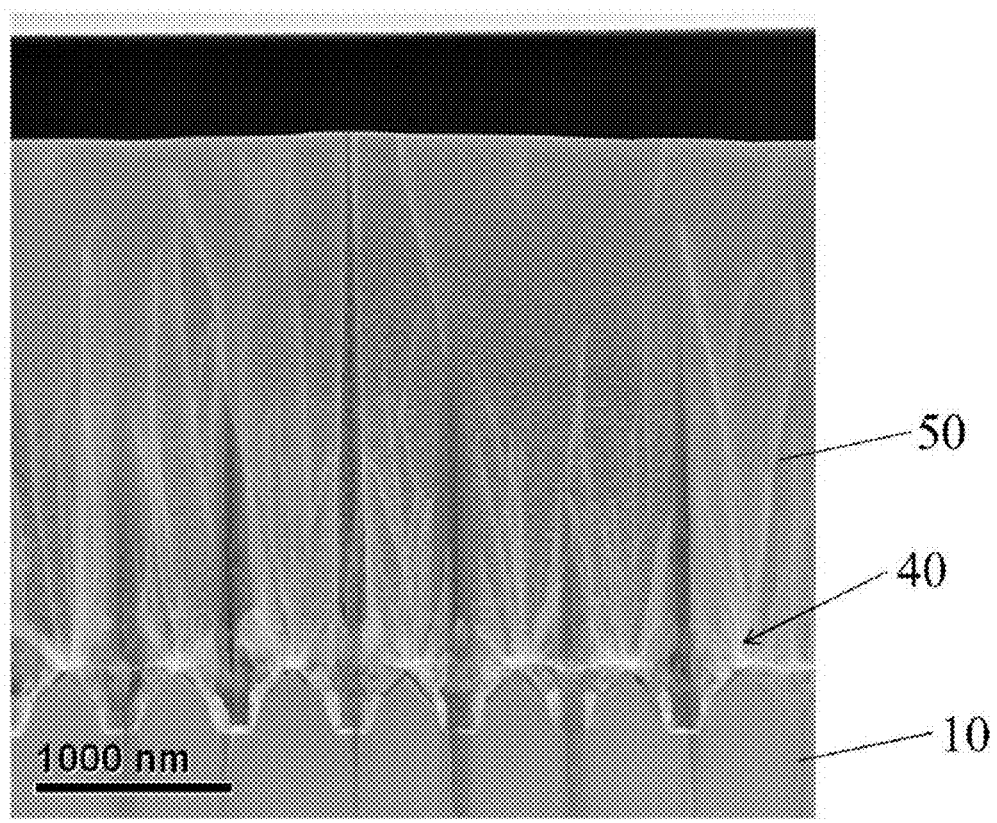
FIG. 4 is cross-sectional SEM diagram of AlN layer grown on the sapphire substrate with patterned structure in accordance with the preferred embodiment of the present invention.

Please refer to FIG. 4, FIG. 4 is cross-sectional SEM diagram of AlN layer grown on the sapphire substrate with patterned structure in accordance with the preferred embodiment of the present invention. In the preferred embodiment, the material of the template layer is AlN, but the present invention is not limited thereto. The material of the template layer may also be selected from a group consisting of AlN, AlGaN, AlGaInN and GaN.

A Metal organic chemical vapor deposition (MOCVD) may be used to process epitaxial growth. Trimethylaluminum (TMAl) and ammonia ($NH_3$) may be used as aluminum and nitrogen sources respectively. In the preferred embodiment, the AlN layer 50 may be grown at a growth temperature ranged between about 1350 and 1400° C. under continuous flow with a low V/III ratio, and its growth rate is in a range about 4 and 6 µm/hr. In the preferred embodiment, a thick of the AlN layer 50 may be in a range between about 1 and 15 µm, and a surface roughness Ra of the AlN layer 50 may be in a range between about 0.001 and 0.5 µm. By utilizing the plurality of the cavities 40 with at least two inclined surfaces, the sapphire substrate of the present invention is capable of achieving a thinner coalescence thickness for AlN layer 50 and decreasing the surface roughness of AlN layer 50 grown on the sapphire substrate, thereby decreasing the epitaxial time and cost for fabricating UV-LED.

Besides, the corresponding TDDs are calculated to be less than $5 \times 10^8$ cm$^{-2}$ from X-ray results. The quality of the AlN layer 50 is obviously much better than that of the conventional AlN layer.

The drawings referred to hereinabove and the detailed description are presented for illustrative purposes only, and are not intended to define meanings or limit the scope of the example embodiments as set forth in the following claims. Those skilled in the art will understand that various modifications and equivalent embodiments are possible. Consequently, the true technical protective scope of the example embodiments must be determined based on the technical spirit of the appended claims.

What is claimed is:

1. A sapphire substrate with patterned structure, comprising:
   a sapphire base with a surface and a plurality of recessed cavities formed on the surface thereof; and
   a template layer disposed on the sapphire base;
   wherein the plurality of the cavities are periodically arranged at a predetermined distance from each other, and each of the plurality of the cavities has a bottom surface and a top opening;
   wherein each of the plurality of the cavities comprises at least a first and a second inclined surfaces, and the first and the second inclined surfaces are inclined by a first and a second angles respectively with respect to the bottom surface of the plurality of the cavities;
   wherein a non-recessed portion of the surface of the sapphire base has a width between edges of the top opening of each of the plurality of the cavities in a range between 0.001 and 1 μm;
   wherein the template layer is disposed on the non-recessed portion of the surface of the sapphire base, and a surface roughness of the template layer is in a range between 0.001 and 0.5 μm, and
   wherein a material of the template layer is selected from a group consisting of aluminum nitride (AlN), aluminium gallium nitride (AlGaN), and aluminum gallium indium nitride (AlGaInN).

2. The sapphire substrate with patterned structure of claim 1, wherein the first angle is smaller than the second angle.

3. The sapphire substrate with patterned structure of claim 2, wherein the first angle is in a range between 30 and 90 degrees.

4. The sapphire substrate with patterned structure of claim 2, wherein the second angle is in a range between 75 and 90 degrees.

5. The sapphire substrate with patterned structure of claim 1, wherein the predetermined distance is in a range between 0.5 and 5 μm.

6. The sapphire substrate with patterned structure of claim 1, wherein a width of the bottom surface of each of the plurality of the cavities is in a range between 0.1 and 4.5 μm.

7. The sapphire substrate with patterned structure of claim 1, wherein a width of the top opening of each of the plurality of the cavities is in a range between 0.5 and 5 μm.

8. The sapphire substrate with patterned structure of claim 1, wherein a height of each of the plurality of the cavities is in a range between 0.1 and 5 μm.

9. The sapphire substrate with patterned structure of claim 1, wherein a height from the bottom surface to an interface between the first and the second inclined surfaces is in a range between 0.05 and 4.5 μm.

10. The sapphire substrate with patterned structure of claim 1, wherein the plurality of the cavities are arranged in hexagonal close-packing.

11. The sapphire substrate with patterned structure of claim 1, wherein a thickness of the template layer is in a range between 1 and 15 μm.

* * * * *